(12) United States Patent
Schuster et al.

(10) Patent No.: US 7,368,915 B2
(45) Date of Patent: May 6, 2008

(54) SHIM BOARD SYSTEM

(75) Inventors: Johann Schuster, Oberasbach (DE);
Lothar Schön, Neunkirchen (DE);
Stefan Stocker, Grossenseebach (DE)

(73) Assignee: Siemens Aktiengesellschaft, Munich (DE)

(*) Notice: Subject to any disclaimer, the term of this patent is extended or adjusted under 35 U.S.C. 154(b) by 157 days.

(21) Appl. No.: 11/444,658

(22) Filed: May 31, 2006

(65) Prior Publication Data
US 2007/0035300 A1 Feb. 15, 2007

(30) Foreign Application Priority Data
May 31, 2005 (DE) .................. 10 2005 025 340

(51) Int. Cl.
*G01V 3/00* (2006.01)
(52) U.S. Cl. ..................... 324/320; 324/318
(58) Field of Classification Search ........ 324/300–322; 600/410–435
See application file for complete search history.

(56) References Cited

U.S. PATENT DOCUMENTS

| 5,373,299 A | * | 12/1994 | Ozaki et al. ................. 342/373 |
| 5,773,976 A | | 6/1998 | Sakakura et al. |
| 6,492,817 B2 | | 12/2002 | Gebhardt et al. |

\* cited by examiner

*Primary Examiner*—Brij Shrivastav
*Assistant Examiner*—Dixomara Vargas
(74) *Attorney, Agent, or Firm*—Schiff Hardin LLP

(57) ABSTRACT

In a shim board system with at least one shim board formed by an insulating substrate and at least one conductor trace on the substrate for generation of a shim magnetic field, in particular for homogenization of the basic magnetic field of a magnetic resonance apparatus, the insulating substrate is fashioned as a mesa in at least one segment similar to the conductor trace and following the curve of the conductor trace. Upon sealing, this allows a good saturation of the shim board system with sealing compound.

6 Claims, 3 Drawing Sheets

SHIM BOARD SYSTEM

BACKGROUND OF THE INVENTION

1. Field of the Invention

The present invention concerns a shim board system of the type having a shim board with an insulated substrate and a conductor trace on the substrate for generation of a magnetic field for shimming another magnetic field.

2. Description of the Prior Art

Magnetic resonance (MR) technology is a known technology for acquisition of slice images of an examination subject using nuclear magnetic resonance signals. In a magnetic resonance apparatus rapidly-switched gradient fields that are generated by a gradient system are superimposed on a static basic magnetic field that is generated by a basic field magnet. The magnetic resonance apparatus also has a radio-frequency system that radiates radio-frequency signals into the examination subject to elicit magnetic resonance signals and acquires the elicited magnetic resonance signals. In the image acquisition, having a high homogeneity of the basic magnetic field is a decisive factor for the quality of the MR images. Inhomogeneities of the basic magnetic field within an imaging volume of the magnetic resonance apparatus cause geometric distortions of the MR image that are proportional to the inhomogeneities. The field homogeneity is particularly important in imaging sequences known as fast pulse sequences, for example in an echo planar method.

Shim systems are used to improve the basic magnetic field homogeneity within the imaging volume. Shim systems can be categorized as passive shim systems and active shim systems. In a passive shim system, a number of iron plates are mounted in the examination chamber of the apparatus in a suitable arrangement.

In an active shim system, to homogenize the basic magnetic field shim coils that can be charged with direct currents are used that are, for example, fashioned as shim boards (circuit boards having a substrate with one or more conductor runs or traces thereon). Mains adaptors that deliver very constant and reproducibly adjustable direct currents are necessary for the operation of the shim coils. Active shim systems are used for, among other things, fine correction to achieve a very high homogeneity, for example in order to correct field distortions caused by the magnetic susceptibility of the examination subject at least partially positioned in the imaging volume. Among other things, shim coils for various field corrections are sealed (potted) with one another, meaning that a sandwich structure is formed that is composed of a substrate plate, a shim coil, another substrate plate, another shim coil etc. in a sequence. Such a design also can be sealed, for example, with a gradient coil unit. In order to allow a transverse passage of sealing material between the shim boards, holes in the substrate plates are arranged at points at which no shim coil conductor is located. Due to the various conductor structures, a sufficient transverse passage of the casting resin is not always to be ensured, such that a complete saturation of the interstices is not assured. Voids thereby created result in a poor resistance arcing and represent mechanical weak points that can lead to a de-lamination of the shim boards and consequently to an increased vibration level.

SUMMARY OF THE INVENTION

An object of the present invention is to provide a shim board system that can be optimally sealed without voids. This object is achieved in accordance with the invention by a shim board system wherein the insulating substrate has at least one segment that is fashioned similar to the conductor trace, following the course of the conductor trace. For example, the insulating substrate on both sides of the conductor trace of the shim coil is broader by a constant amount than the conductor trace itself. The excess is, for example, between approximately 0.5 and 5 mm. In an embodiment, in order to ensure the defined conductor structure even given mechanical installation of the gradient coil, at least one connection web can be perpendicularly left or subsequently mounted between two conductor traces.

The substrate plate is thus optimized for the conductor structure in order to achieve an optimally permeable design for the epoxy sealing. The inventive shim board has the following advantages. It exhibits a defined conductor structure. It leads to a reliable insulation between shim board layers situated one on top of the other. It produces the greatest possible transverse permeability for a sealing resin (in particular containing filling material) between multiple shim boards situated one atop the other. It prevents saturation voids and improves the partial discharge behavior. It improves the mechanical stability of the cured shim board-sealing compound joint.

DESCRIPTION OF THE PREFERRED EMBODIMENTS

Figure 1:
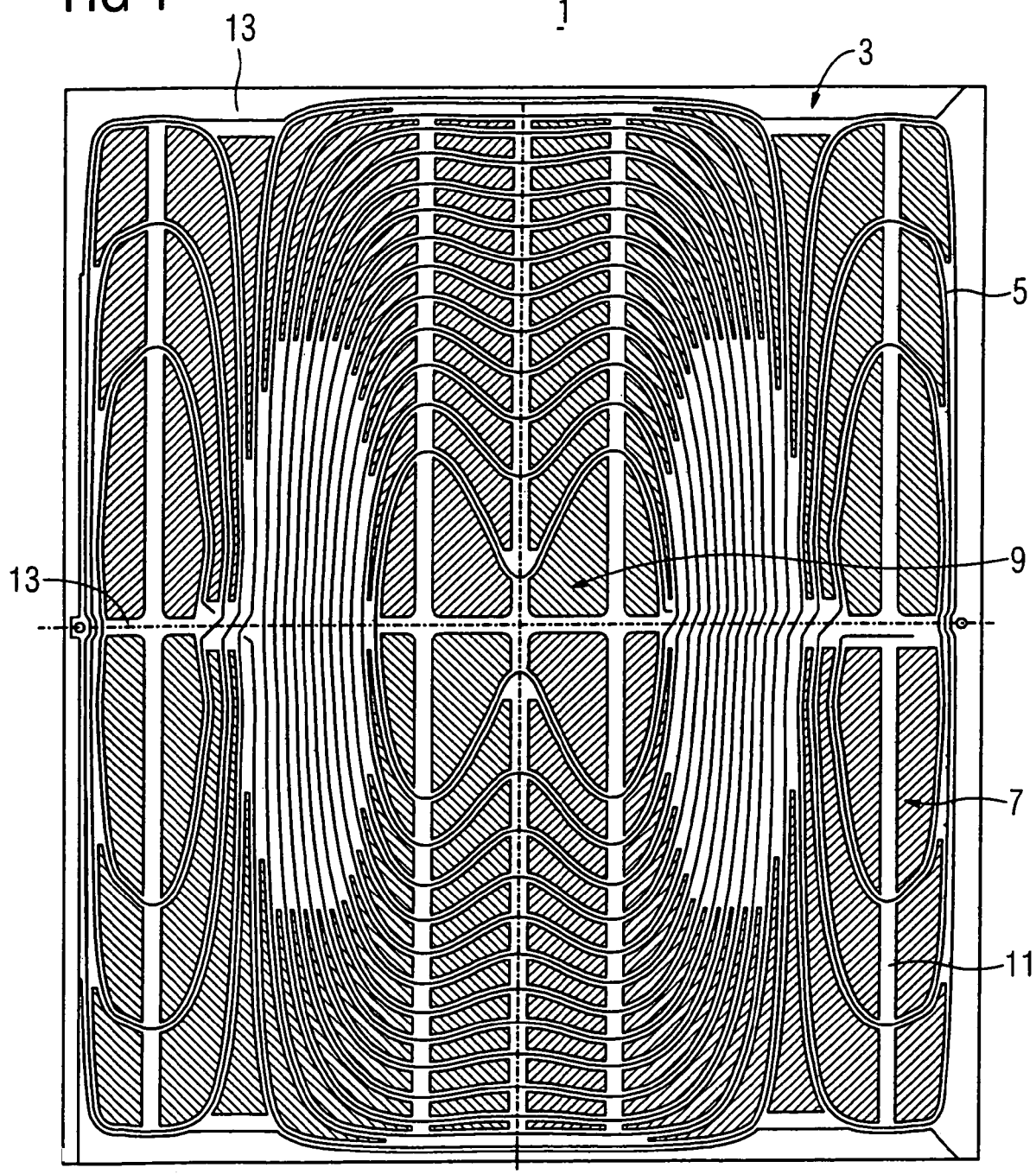
FIG. 1 is an overview of an unrolled shim board in accordance with the invention.

FIG. 1 shows an exemplary embodiment of the invention using an unwound shim board 1 which, for example, can be sealed together with a hollow-cylindrical gradient coil unit and arranged within a hollow-cylindrical basic field magnet for field homogenization. The invention is also realizable for open magnetic resonance apparatuses with planar gradient coil units.

The unwound shim board 1 is shaped as a rectangular cylinder jacket. It has a glass fiber-reinforced plastic substrate 3 of, for example, 0.4 mm thickness and a shim conductor trace 5 made from copper with a thickness of, for example, 0.2 mm that exhibits a specific curve that is designed for the correction of a magnetic field component. In the regions with large distance from the conductor traces (meaning, for example, in the boundary region 7 and in the center 9 of the cylinder jacket), large segments of the substrate plate have been countersunk (hatched regions) such that the substrate 3 exhibits a mesa structure conforming to the portion of the conductor trace 5 supported thereon. For stabilization of the structure, multiple webs 11 are present that run azimuthally in the rolled-up state and are axially connected with one another by webs 13. Preferably the webs 11 connect mesa structures that respectively support geometrically similar portions of the conductor trace 5.

Figure 2:
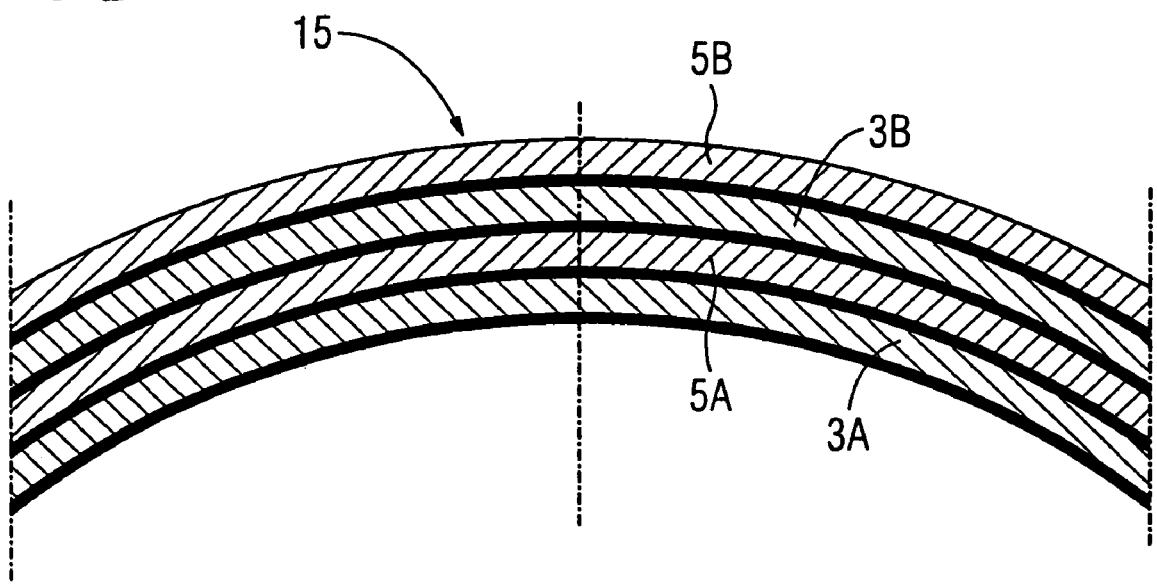
FIG. 2 is a segment of a cross-section through a shim board system in accordance with the invention.

As a segment of a hollow cylinder, FIG. 2 shows a ply structure 15 formed by two substrates 3A and 3B and two conductor layers 5A and 5B. Upon sealing, it must be ensured that a saturation of the ply structure can ensue with a radial transverse flow (direction indicated by the arrow) of the sealing compound. This is provided due to the high permeability of the substrate structure.

Figure 3:
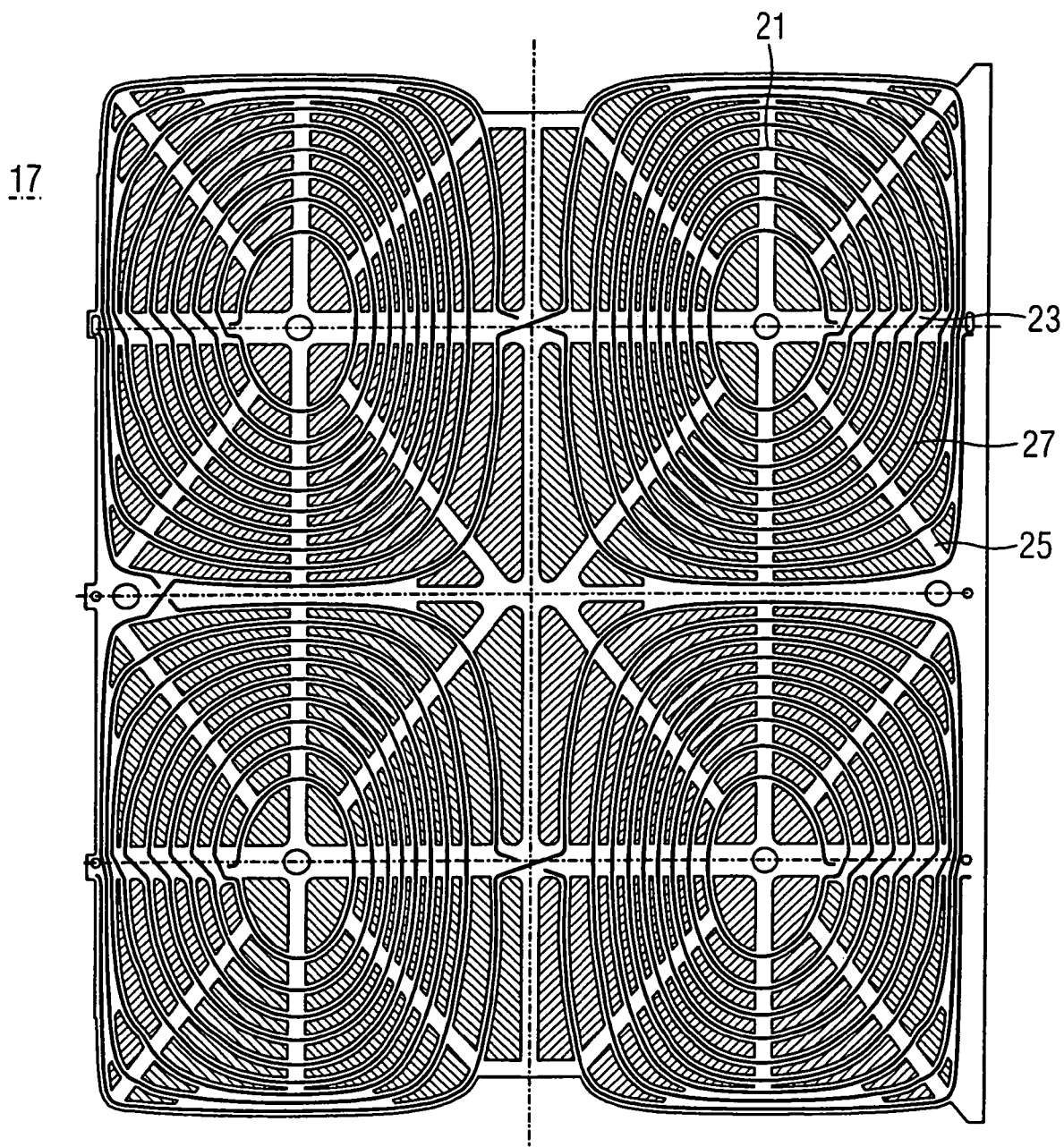
FIG. 3 is a further overview of a shim board in accordance with the invention, with segments similar to conductor traces that allow an improved sealing given overlay on the shim board of FIG. 1.

For example, the ply structure 15 is formed by the shim board 1 according to FIG. 1 and a shim plate 17 according to FIG. 3. For stabilization, the latter additionally has webs 25 running at angles as well as azimuthal webs 21 and radial webs 23, which webs 25 running at angles connect segments of the substrate similar to conductor traces for conductors 27 running on circular paths. In such a ply structure, due to the web connections, the transverse flow is only hindered by a few zones in which a countersinking of the substrate plates is not possible due to conductor traces situated close to one another.

Although modifications and changes may be suggested by those skilled in the art, it is the intention of the inventors to embody within the patent warranted hereon all changes and modifications as reasonably and properly come within the scope of their contribution to the art.

We claim as our invention:

1. A shim board system comprising:
   at least one shim board comprising an insulating substrate and at least one conductor trace on said substrate in a configuration formed by a conductor path to generate an active magnetic field for shimming another magnetic field; and
   said insulating substrate comprising countersunk regions, on which said conductor trace is not disposed, with at least one mesa segment, on which a portion of said conductor trace is disposed, between two of said countersunk regions, said at least one mesa segment conforming to the configuration of said portion of said conductor trace.

2. A shim board system as claimed in claim 1 wherein said at least one mesa segment has a width that is larger than a width of said portion of said conductor trace.

3. A shim board system as claimed in claim 2 wherein said at least one mesa segment is wider by a constant amount, along said portion of said conductor trace, than said width of said conductor trace.

4. A shim board system as claimed in claim 1 wherein said insulating substrate comprises a plurality of mesa segments with respective portions of said conductor trace thereon, said portions of said conductor trace including portions of said conductor trace that are geometrically similar to each other, and said insulating substrate comprising stabilizing connection webs respectively connecting the mesa segments on which said geometrically similar portions of said conductor trace are disposed.

5. A shim board system as claimed in claim 1 wherein said insulating substrate comprises a plurality of substrate layers, and wherein said conductor trace comprises a plurality of conductor trace layers, each substrate layer having one of said conductor trace layers thereon, and said substrate layers and conductor trace layers alternating in a ply structure, and comprising sealing compound holding said ply structure together and filling said countersunk regions.

6. A shim board system as claimed in claim 4 wherein adjacent substrate layers and conductor trace layers in said ply structure are disposed to allow flow-through of said sealing compound between the adjacent layers.

* * * * *